United States Patent [19]

Ulrich

[11] Patent Number: 5,753,417
[45] Date of Patent: May 19, 1998

[54] MULTIPLE EXPOSURE MASKING SYSTEM FOR FORMING MULTI-LEVEL RESIST PROFILES

[75] Inventor: Bruce Dale Ulrich, Beaverton, Oreg.

[73] Assignees: Sharp Microelectronics Technology, Inc., Camas, Wash.; Sharp Kabushiki Kaisha, Osaka, Japan

[21] Appl. No.: 665,013

[22] Filed: Jun. 10, 1996

[51] Int. Cl.$^6$ ............................................. G03F 9/00
[52] U.S. Cl. .................. 430/312; 430/5; 430/394; 430/322
[58] Field of Search ...................... 430/5, 322, 394, 430/311, 312

[56] References Cited

U.S. PATENT DOCUMENTS

| | | | |
|---|---|---|---|
| 5,237,393 | 8/1993 | Tominaga | 356/401 |
| 5,244,759 | 9/1993 | Pierrat | 430/5 |
| 5,308,721 | 5/1994 | Garofalo et al. | 430/5 |
| 5,384,218 | 1/1995 | Tokui et al. | 430/5 |
| 5,439,764 | 8/1995 | Alter et al. | 430/5 |

OTHER PUBLICATIONS

Article entitled, "Phase Masks and Grey-Tone Masks", by Pierre Sixt, Litomask by SCEM, Neuchatel, Switzerland, printed in Semiconductor Fabtech, Issue No. 23/1995, pp. 209-213.

*Primary Examiner*—S. Rosasco
*Attorney, Agent, or Firm*—David C. Ripma; Gerald W. Maliszewski

[57] ABSTRACT

A method is provided for forming multi-level profiles from a photoresist mask. The method includes exposing selected areas of a photoresist layer to two or more different patterns of light at different light dosage levels. For example, one pattern will be exposed to a relatively low dose of light, or to light for a short duration, and a second pattern will be exposed to a relatively high dose of light, or for a greater duration. The plurality of different exposures at different dosage levels occur prior to developing the photoresist. When the photoresist layer is developed, the pattern exposed to a lower dose of light will be etched substantially more slowly than the areas of the photoresist exposed to higher dose of light. By controlling the development process to completely remove the resist in the areas exposed to a high dose of light and only partially remove the resist in the areas exposed to a lower dose of light, a multi-level photoresist profile is formed. Such a multi-level profile can then be used in subsequent semiconductor processing, for example, the formation of interconnects and vias.

14 Claims, 4 Drawing Sheets

MULTIPLE EXPOSURE MASKING SYSTEM FOR FORMING MULTI-LEVEL RESIST PROFILES

BACKGROUND AND SUMMARY OF THE INVENTION

The invention relates generally to integrated circuit fabrication methods and, more particularly, to processes employed in the formation of interconnects and vias used in integrated circuits.

An important part of the fabrication of very large scale integrated circuits is the provision of vias and other conductive interconnections between the various circuit elements. The conventional method for forming a via or interconnect in an IC circuit is the etch process. In this process aluminum or another suitable metal is deposited on the substrate surface with a sputtering technique that is well-known in the art. The aluminum forms a layer completely covering the substrate surface. A patterned photoresist profile is then formed over the aluminum to protect the aluminum which is to remain. The substrate and photoresist are then etched, typically with an anisotropic plasma etch, to precisely remove the unwanted aluminum. The area formerly occupied by the removed aluminum is then filled with a dielectric material, such as oxide. The oxide and aluminum extend over the original substrate surface. The surface of this new layer, likewise, has a surface which is typically smoothed with a chemical mechanical polish (CMP) as is well known in the art. The newly polished surface reveals areas of aluminum for making further interconnections.

As devices on semiconductor wafers shrink to sub-micron dimensions and the number of individual components on a chip necessitate ever higher packing densities, the architectural complexity of interconnections continues to grow. One technique which has been developed to improve on the above-described aluminum etch process to provide large numbers of multi-level interconnects is known as the damascene process or the inlay process.

In the damascene process, the substrate surface, including transistors and other devices formed on the wafer, is first covered with a dielectric layer such as oxide. A patterned photoresist profile is then formed on the surface of the dielectric. The resist profile has openings, or holes, in the photoresist corresponding to the areas where vias are to be formed in the dielectric. Other areas of the resist are formed into elongated openings to create interconnect lines. The photoresist-covered dielectric layer is then etched to remove oxide underlying the openings in the photoresist. The photoresist is then stripped away. Copper or another suitable metal is then used to fill the vias and interconnects, the metal typically being deposited by chemical vapor deposition (CVD). The result is a dielectric layer with conductive metal at various levels therein. The surface of the dielectric layer is typically smoothed using a CMP process. Additional dielectric layers are then added to complete the required interconnections for the chip. Such dielectric layers with interconnects and vias formed by damascene or inlay processes are sometimes referred to as interlevel dielectrics or, alternatively, as interlevel dielectric layers.

Production of integrated circuits using the damascene process involves high-resolution photolithography to create ultra-thin lines and vias in the dielectric. Patterns of openings are formed in the overlying photosensitive resist (hereinafter "photoresist" or "resist") by directing the desired patterns of light onto the photoresist, the light being of a wavelength to which the photoresist is sensitive. Subsequently, the photoresist is "developed" to remove the light-exposed areas, leaving behind a photoresist mask on the surface of the dielectric. The photoresist mask is then used as a pattern in subsequent etching of the underlying dielectric.

A technique widely used in IC production employs reticles on which the desired mask pattern is formed, often reproduced multiple times to expose multiple areas of a wafer simultaneously. Light is directed through the reticle to the surface of the photoresist layer on the wafer, exposing the target areas to the mask pattern. When forming multi-level interconnect lines and vias in a dielectric layer such as silicon dioxide, the process of forming a photoresist mask is repeated numerous times. The desired features at each level of the dielectric, such as a line or via, is formed by: (1) laying down a layer of resist on the dielectric; (2) exposing the resist to a light pattern having the desired features; (3) developing the resist to remove the areas of the photoresist which were exposed; (4) etching the dielectric through the patterned resist to transfer the pattern to the dielectric; (5) stripping off the resist layer; (6) depositing conductive metal in the vias and interconnects and polishing the surface of the oxide; (7) adding a new layer of dielectric to be patterned; (8) forming another layer of resist; and (9) repeating steps 2, 3, 4, etc. That means the photoresist is developed after each exposure to a mask pattern and, following subsequent processing (for as long as new features are being added), a new layer of photoresist is again applied, exposed, and developed. Each such handling step requires precision alignment of the mask and wafer.

In high-density wafer fabrication, even sub-em size variations in alignment between the various masking steps can degrade or destroy all or a large number of chips on a wafer. It would be advantageous if the number of photoresist mask patterns required in integrated circuit processing could be reduced during the formation of interconnects and vias since the formation of each photoresist pattern requires numerous processing steps and involves the potential for misalignments to occur.

It would also be advantageous for a single layer of photoresist to serve as a mask pattern for etching two or more levels within an interlevel dielectric layer. That saves processing steps and insures that, for the processing steps thus combined, the masks are automatically self-aligned.

Accordingly, the present invention provides a method of forming a photoresist mask for use in making integrated circuit connections in an interlevel dielectric layer. The method comprises the step of providing a layer of photoresist having a predetermined thickness on the interlevel dielectric. Light is then directed to the photoresist through a first mask pattern to create a first expose pattern in the photoresist. Before the photoresist is developed, light is again directed to the photoresist through a second mask pattern to create a second exposure pattern in the photoresist. Then the photoresist is developed to remove a first thickness of the photoresist, less than the full predetermined thickness of the photoresist layer, in the areas of the first exposure pattern, and to remove a second thickness of the photoresist in the areas of the second exposure pattern. Thus, the developed photoresist mask includes areas of photoresist having a plurality of different thicknesses.

The method preferably includes using light at a first selected exposure level when creating the first exposure pattern in the photoresist and light at a second selected exposure level, different from the first exposure level, when creating the second exposure pattern in the photoresist. The first and second exposure levels are selected by controlling the level of light intensity, or the duration of the light exposure, or both. The difference between the first and second exposure levels allows for differentiating the amount of resist which is removed during the developing step. Those areas exposed to a higher dose of photons will develop faster than the areas exposed to a lower dose of photons. By controlling the time, temperature, and concentration of the developer during the developing step, it is possible to remove only part of the full thickness of the photoresist in the areas receiving a lower dose of photons, i.e., the first exposure pattern, and to remove, for example, the entire thickness of the photoresist layer in the areas receiving a higher dose of photons, i.e., the second exposure pattern.

The method of the present invention is particularly suitable for use in patterning interconnects and vias in the interlevel dielectric layer which overlies integrated circuit elements on a wafer. Light at a first exposure level is directed at selected areas of the photoresist, defined by a first mask pattern, to create a first exposure pattern in the photoresist. Without developing the photoresist, selected areas of the photoresist defined by a second mask pattern are then exposed to light at a second, higher or lower, exposure level to create a second exposure pattern in the photoresist. The photoresist is then developed to remove a first thickness of the photoresist in the areas of the first exposure pattern and to remove a second thickness in the areas of the second exposure pattern. Assuming the first exposure level of light used to expose the first exposure pattern is at a lower exposure level than the second exposure level of the light used to expose the second exposure pattern, the developing step can be controlled to remove less photoresist from the areas exposed to the first exposure pattern Preferably, the full thickness of the photoresist is removed from the areas receiving the higher exposure level of light (e.g., the second exposure pattern at the second exposure level) and less than the full thickness is removed from the areas receiving the lower exposure level of light (e.g., the first exposure pattern at the first exposure level). The result after developing is a photoresist mask on the substrate which includes areas having a plurality of different thicknesses, including the unexposed areas having substantially the full predetermined thickness of the photoresist layer, the areas of the first exposure pattern which have a thickness less than the full predetermined thickness, and holes or openings where the photoresist has been removed in the areas of the second exposure pattern.

The resultant multi-layered photoresist mask is suitable for use in forming multi-level interconnects and vias in the interlevel dielectric using pattern transfer techniques. A suitable pattern transfer technique for this purpose is described in co-pending patent application Ser. No. 08/665, 014, filed Jun. 10, 1996, entitled "Method for Transferring Multi-Level Photoresist Pattern", invented by Tue Nguyen, Sheng Teng Hsu, Jer-shen Maa, and Bruce Dale Ulrich, Attorney Docket No. SMT 162, which is assigned to the same assignees as is the present invention.

DETAILED DESCRIPTION OF THE PREFERRED EMBODIMENT

Figure 1:
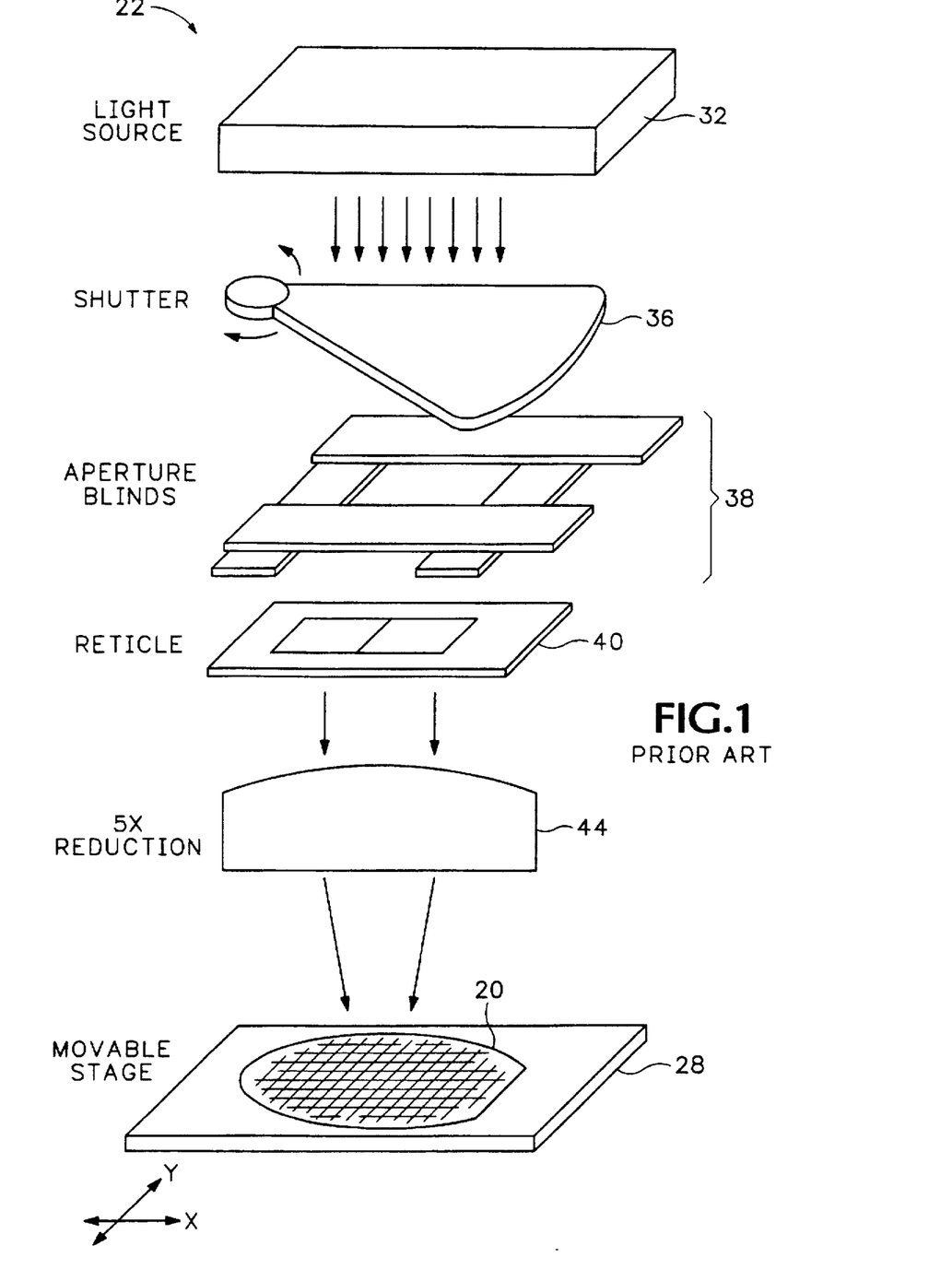
FIG. 1 is a partial schematic depiction of selected parts of suitable photolithographic processing equipment used in the fabrication of semiconductor integrated circuits (prior art).

FIG. 1 is a schematic view of selected parts of an optical photolithography apparatus 22 used in integrated circuit processing. The figure shows a semiconductor wafer 20 on a moveable, programmable stage 28 and light is being directed through the optical photolithographic apparatus 22 to a selected region on wafer 20.

Wafer 20 is semiconductor wafer which serves as a substrate for the fabrication of a plurality of integrated circuit chips. The number, layout, density and design of individual chips on a wafer is a matter of design choice unrelated to the present invention. It is assumed that wafer 20 is being processed in apparatus 22 to reproduce a plurality of identical integrated circuit chips laid out in rows and columns in the wafer. At the stage of production illustrated in FIG. 1, the surface of wafer 20 is coated with a dielectric layer covered by a layer of photoresist. The photoresist has been previously applied to the wafer at a different processing station (not shown) known as a coat line. On the coat line, the photoresist is applied in a uniform manner over the surface of the wafer. Thus prepared, wafer 20 is then transferred to the movable stage 28 at the base of apparatus 22 where the photoresist is selectively exposed to light energy to form various exposure patterns in the resist.

The purpose of photolithographic apparatus 22 is to expose selected areas of the photoresist on wafer 20 to precisely detailed, masked patterns of light. A light source 32 is provided on the apparatus which produces light of a suitable wavelength, to which the photoresist on wafer 20 reacts. Typically, a mercury arc lamp is used for light source 32. The light is directed through a shutter mechanism 36 suitable for controlling the duration of the light exposure each time a light pattern is directed at the wafer. The light is passed through a reticle 40 which defines the desired mask patterns on the surface of wafer 20. Reticles 40 are inscribed with the desired mask pattern or patterns used in exposing the wafer. In semiconductor production the patterns are changed after each exposure is completed by replacing the reticle. Aperture blinds 38 mask off the parts of the reticle which do not contain the desired pattern. Such blinds can be repositioned and function with the movable stage 28 to ensure that the correct pattern reaches the target areas 39 of the wafer 20. Suitable reduction optics 44 focus the light, which has passed through reticle 40, onto the target areas 39 of wafer 20. The reduction optics permit the patterns on reticle 40 to be substantially larger than the exposure patterns on wafer 20. The present invention does not require the use of optical reduction between the reticle and the wafer and, in the description of the method which follows, reduction optics 44 are omitted for simplicity. Reduction optics are, nevertheless, shown in FIG. 1 because such optics are typical in photolithography. A typical reduction ratio for photolithographic optics is 5:1, i.e., the pattern on the reticle is five times the size of the target area pattern.

Each reticle 40 is typically a quartz or glass plate with one or more mask patterns formed thereon. The mask patterns have openings for permitting light to pass through the reticle, and masked or opaque areas for blocking the passage of light. The opaque regions of the mask are typically coated with chromium or chromium oxide. The design and construction of reticles for photolithographic processing is a subject of ongoing research and development. For example, certain types of reticles have been designed for ultra-fine-line exposures at selected wavelengths of light. For purposes of the present invention, the reticle 40 is assumed to be of a type suitable for exposing the surface of a wafer 20 with a masked pattern of light, including regions where light passes through the reticle, and opaque regions where the light is blocked from reaching the surface of the wafer.

Moveable stage 28 on which wafer 20 is positioned is designed to bring selected regions of wafer 20 within the range of the light pattern which passes through reticle 40. Typically, reticle 40 and optics 44 are designed to expose the photoresist on wafer 20 in only a small region of the wafer surface. For example, an 8-inch wafer might contain dozens, or even hundreds of individual integrated circuit chips. The optics of apparatus 22 allow only a small target area 39 to be exposed at a time, the target area encompassing perhaps between 1 and 6 chips. Reticle 40 is designed to simultaneously reproduce the desired mask pattern for each of the individual integrated circuit chips covered in each exposure. Shutter 36 controls the duration of each exposure. After each small region of wafer 20 is exposed, moveable stage 28 moves the wafer in a suitable x, y direction to expose another area of the wafer. This process is repeated until the entire wafer 20 has been exposed to the mask pattern or patterns of light from light source 32 passing through reticle 40.

Figure 2:
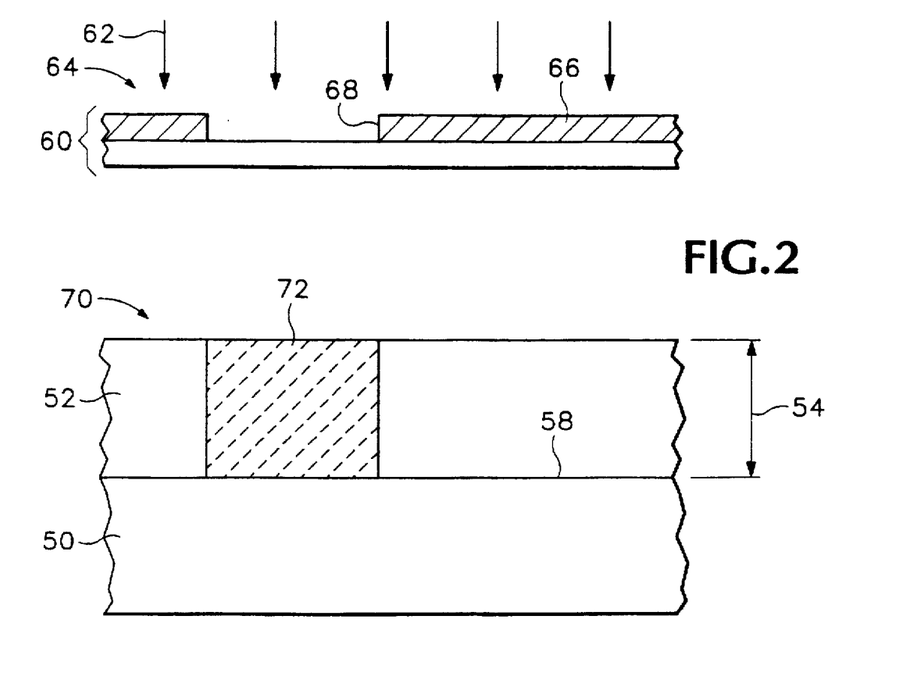
FIG. 2 is a partial side cross-sectional view of a reticle and target area on a wafer, greatly enlarged as compared with like elements in FIG. 1, showing the first mask patterning step for directing light to selected areas of the photoresist to create a first exposure pattern in the photoresist layer.

FIG. 2 is a cross-sectional schematic view, greatly enlarged, showing selected parts of a photolithographic optical apparatus similar to apparatus 22 in FIG. 1. The bottom half of FIG. 2 shows a small portion of the target region of a wafer 20 (as in FIG. 1) illustrated in cross section. The substrate of the wafer is omitted and a portion of the interlevel dielectric layer 50, which overlies the wafer substrate and any devices formed thereon, is shown. Interlevel dielectric layer 50 layer is typically a layer of oxide, such as silicon dioxide ($SiO_2$). The first step in the method of the present invention for forming a photoresist mask used in making integrated circuit connections in interlevel dielectric layer 50, is to provide a layer of photoresist 52 on the surface 58 of dielectric layer 50. Photoresist layer 52 has a predetermined thickness 54 between the top surface 56 of the resist and the surface 58 of substrate 50. Photoresist layer 52 is typically formed to a uniform thickness by well-known processes carried out on a coat line (not shown). A suitable thickness for photoresist layer 52 is 1.5–1.8 microns (μm). As is known to those skilled in the art, a photoresist layer will be exposed to light, of a wavelength to which it is reactive, using the apparatus 22 of FIG. 1. The photoresist is then subsequently developed to remove certain areas of the resist, forming lines and holes and other suitable patterns therein. Once patterned, resist 52 is subsequently used as a mask to etch substrate 50. The present invention is directed to a method of forming a multi-level profile in resist layer 52.

The top portion of FIG. 2 shows a small portion of a reticle 60 similar to reticle 40 shown in FIG. 1. Reticle 60 in FIG. 2 extends over substrate 50 and resist 52. To simplify the explanation of the invention, the reduction optics 44 of the apparatus 22 in FIG. 1 have been eliminated from FIGS. 2, 3, and 7, and from the descriptions associated therewith. Reticle 60 is assumed to have patterns thereon identical in size to the patterns which are formed in resist layer 52. That is, light 62 from a suitable source (not shown) passes through reticle 60 and forms patterns of lines and openings on the surface 56 of photoresist layer 52 identical in size to the patterns on the reticle. In other words, the size ratio between the reticle and the target area on the wafer is 1:1. For simplicity, other elements of apparatus 22 shown in FIG. 1 are also omitted from FIGS. 2, 3, and 7, including the light source 32, shutter 36, and aperture blinds 38.

Following the first step in the method of the present invention, described above, in which a layer 52 of photoresist is provided on dielectric layer 50, the next step, illustrated in FIG. 2, is to direct light to the photoresist through a first mask pattern to create a first exposure pattern in the photoresist. The first mask pattern is the pattern 64 illustrated on reticle 60, which is a small portion of a typical reticle pattern, greatly simplified to more easily explain the invention. Similarly, the region of photoresist 52 shown in FIG. 2 is a small portion of the target region on a typical wafer. In the illustrated embodiment the pattern includes opaque material, such as chromium oxide 66, covering a substantial portion of reticle 60, and has an opening 68 through which light 62 from a suitable source (not shown) passes. The light passing through reticle opening 68 exposes an area 72 in resist layer 52. As is well known, photoresist is sensitive to photons of light and changes chemically in the regions where the light enters the resist. The larger the "dose" of photons entering the resist, the greater the chemical reaction.

FIG. 2 shows the step of directing light to photoresist layer 52 through a first mask pattern, which is pattern 62 on reticle 60, to create a first exposure pattern 70 in the photoresist. Exposure pattern 70 is the area 72 which receives light through opening 68 in mask pattern 62. Area 72 is chemically changed by the exposure to light and the degree or amount of the chemical change is determined by the level of exposure to the light. In the step illustrated in FIG. 2, photoresist layer 52 is exposed to light using first mask pattern 62, at a first exposure level, to create first exposure pattern 70. The first exposure level is a reference to a selected "dose" of photons. In this and subsequent steps, the dose of photons directed to photoresist layer 52 is controlled either by the intensity or power of the light 62 directed through the reticle, or by the duration of the light burst controlled by shutter 36 of apparatus 22 (see FIG. 1). Typically, the dose or exposure level is controlled, in apparatus 22, by shutter 36. A lower dose means exposure for a shorter duration; a higher dose means exposure for a longer duration.

Figure 3:
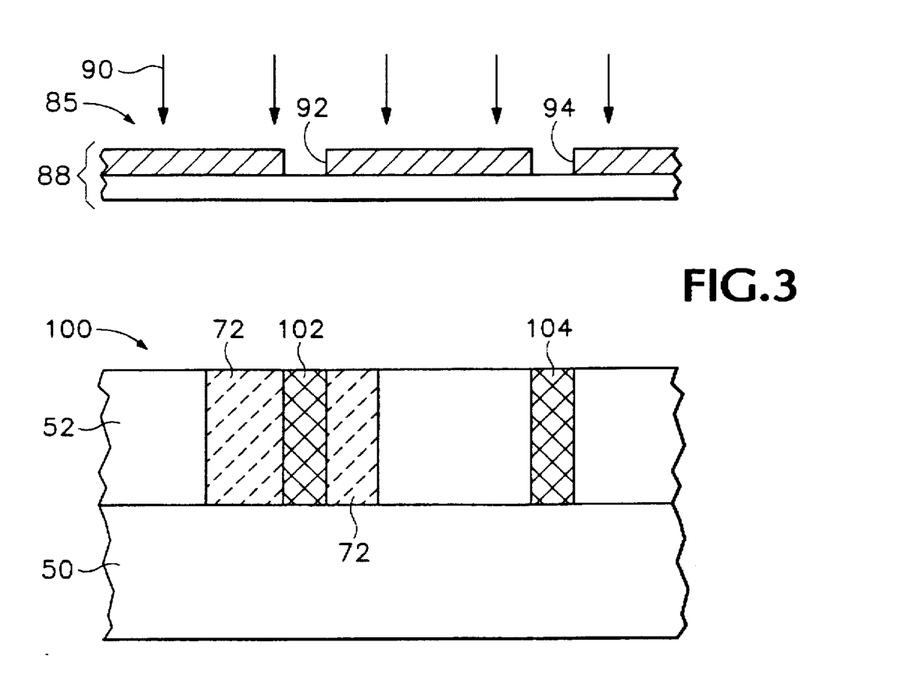
FIG. 3 is a side cross-sectional view as in FIG. 2 showing the second mask patterning step for directing light to selected areas of the photoresist to create a second exposure pattern in the photoresist layer.

FIG. 3, which is like FIG. 2 and reproduces the portion of dielectric layer 50 and photoresist 52, and also shows a reticle 88 similar to reticle 60 (but not necessarily the same reticle), illustrates the next step in the method. FIG. 3 shows the step of directing light to photoresist layer 52 through a second mask pattern, formed on reticle 88, to create a second exposure pattern 100 in the photoresist. This step is carried out subsequent to the step shown and described with reference to FIG. 2 and before the photoresist is developed. In the step shown in FIG. 3, a different mask pattern 85 on the same or a different reticle 88 is positioned over the target region of the wafer. Light 90 having a different exposure level from the light 62 used in the preceding step, referred to herein as light having a second exposure level, is directed through second mask pattern 85. The second mask pattern, which in this example is intended to create vias in the substrate 50 underlying the photoresist, includes two narrow openings 92, 94 in an otherwise opaque expanse. Light 90 at the second exposure level passes through the mask pattern 85 of reticle 88 and enters photoresist layer 52 to create a second exposure pattern 100 in the photoresist. The second exposure pattern includes two narrow areas 102, 104 of light-exposed photoresist in registration with reticle openings 92, 94, respectively.

It is assumed in this example that the second exposure level of light used in the second exposure step illustrated in FIG. 3 is substantially higher (i.e., a larger dose of photons per unit area) than the first exposure level from light source 62 used in the first exposure step illustrated in FIG. 2. To schematically illustrate the difference in the exposure patterns in photoresist layer 52, the areas of resist exposed only during the first exposure step are lightly crosshatched with dashed lines as shown at 72. The second exposure pattern 102, 104 is shown with heavy dark cross hatching at 102, 104. As can be seen in FIG. 3, the first and second exposure patterns overlap within region 72. The effect of the overlap will be described below.

Figure 4:
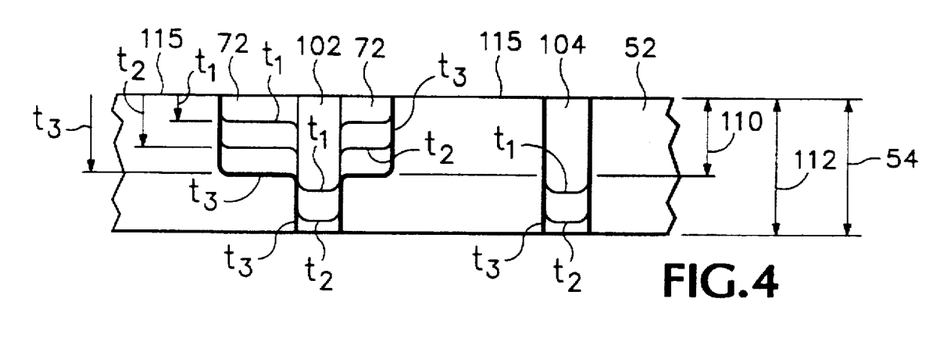
FIG. 4 is a side cross-sectional view of the photoresist layer of FIGS. 2 and 3 illustrating the developing step of the present invention.

The next step in the method is illustrated in FIG. 4, which is the developing step. As noted above, the two exposures which create exposure patterns 70, 100 in photoresist layer 52 were created before the photoresist layer is developed. To develop the photoresist, the exposed wafer 20 (see FIG. 1) is removed from moveable stage 28 and sent to a developer line (not shown) in which photolithographic developing processes are performed. In the developing of photoresist, the areas of the resist which have been exposed to light energy are washed away. The process of developing is well known and will not be described in detail except for those techniques important to the present invention. Referring to FIG. 4, resist layer 52 is subjected to a conventional developer, such as TMAH, which etches or removes the resist at a rate, which is dependent on the amount of light exposure received by the resist. For example, in an area which has received a heavy dose of photons in the resist, the developer will etch the resist at a rate approximately 1,000 times faster than the surrounding, unexposed, resist. In areas that have received a lighter dose of photons, the differential etch rate between exposed and unexposed areas might be, for example, only 500-to-1. The present invention takes advantage of the differences in the etch rate of photolithographic developer depending on the amount of light exposure received by the resist in order to selectively etch the resist at different rates.

In FIG. 4, the photoresist layer 52 of FIG. 3 is reproduced with the first and second exposure patterns 70, 100 shown. The cross hatching shown in FIG. 3 is omitted. As described above, areas 72 (i.e., the first exposure pattern) have received a first exposure level of light which is assumed to be a low dose of photons. Areas 102, 104 (i.e., the second exposure pattern) have received the second exposure level of light which is assumed to be a higher dose of photons. The action of the developer over time is illustrated schematically by contours $t_1$, $t_2$, $t_3$. At time $t_1$, early in the development process, the developer has started to remove the resist from the first exposure pattern area 72 and has proceeded much further with etching the resist in the second exposure pattern areas 102, 104. At time $t_2$, somewhat more of region 72 has been removed and nearly the full thickness of photoresist layer 52 has been removed from regions 102, 104. In region 102, which is the part of the second exposure pattern that overlaps the first exposure pattern, the development process is somewhat faster than in region 104. That is because region 102 was exposed to additional photons of light during the first exposure step (FIG. 2) prior to the second exposure step (FIG. 3). Thus, the total dose of photons in area 102 is slightly greater than in area 104 and the developer works slightly faster in area 102.

At time $t_3$, the developer has removed a substantial portion of the first exposure pattern area 72, but a substantial portion of the resist still remains. And the full thickness of resist layer 52 has been removed from areas 102 and 104. At this point, in accordance with the present invention, the development process is stopped. The result of the development step illustrated in FIG. 4 is that only a first thickness 110 is removed from the photoresist layer 52 in the areas of the first exposure pattern 72 and a second thickness of photoresist 112 is removed from the areas of the second exposure pattern 102, 104. In the preferred embodiment, the second thickness 112 is generally equal to the predetermined overall thickness 54 of photoresist layer 52. In other words, holes or openings through the resist are formed in the areas of the second exposure pattern 102, 104 and areas of thin photoresist are formed in the areas of the first exposure pattern 72. The remaining areas of the photoresist 115, which were not exposed to any light, remain substantially the full thickness 54 of photoresist layer 52. As such, the method of the present invention produces a photoresist mask that includes areas of photoresist having a plurality of different thicknesses, 115, 110, and zero thickness in second exposure pattern areas 102, 104.

The following is an example of how the above-described method is used to create a multi-level photoresist profile on an interlevel dielectric in accordance with the present invention:

EXAMPLE

A wafer is provided with an overlying layer of oxide on which is formed a substantially uniform surface layer of photoresist approximately 1.5–1.8 µm thick. Using a photolithographic illuminating apparatus such as the one schematically illustrated in FIG. 1, selected regions of the wafer are exposed to light from a mercury arc lamp. The I-line portion of the lamp spectrum is used for the exposures, at a wave length of 0.365 µm. In this example, the photoresist will be exposed to two mask patterns creating first and second exposure patterns in the photoresist. A single reticle is used incorporating both the first and second mask patterns at different locations on the reticle.

Light from the mercury arc lamp is passed through the first mask pattern 62, shown in FIG. 2. The first exposure level for creating the first mask pattern 70 of FIG. 2 is an exposure of 170-milliseconds' duration. The duration of the first exposure is controlled by shutter 36. Each target region of wafer 20 (see FIG. 1) is exposed for 170-milliseconds and then moveable stage 28 is indexed to the next position at which another region of the wafer is exposed. For example, on a wafer which is divided into 100 integrated circuit chips, and assuming the reticle is able to expose two chips at a time with duplicate first mask patterns, moveable stage 28 will index 50 different times to new positions and at each position shutter 36 will be opened for 170 milliseconds.

Once the first exposure pattern has been applied to each integrated circuit chip on the wafer, the masked pattern used for the second exposure is installed in apparatus 22 (FIG. 1). In the present invention, both the first and second mask patterns can be on the same reticle. By shifting the aperture blinds 38 (FIG. 1) from one region of the reticle to another, the desired mask pattern can be selected. Alternatively, a different reticle can be installed in apparatus 22 during the second exposure step. However the mask pattern is changed, following the first exposure described in the preceding paragraph, the target regions on the wafer are exposed to the second mask pattern at a second exposure level. Assuming the second mask pattern is as shown in FIG. 3, a heavy dose of photons will be supplied through the openings 92, 94 in second mask pattern 85. Shutter 36 will open for 500-milliseconds to complete each second exposure pattern on the photoresist. Assuming, as before, that two integrated circuit chips are exposed during each 500-milliseconds exposure, and 100 integrated circuit chips are fabricated on wafer 20, moveable stage 28 will index 50 times to complete the second exposure pattern on each chip. Following completion of the second exposure, the wafer will be transferred to a developer line for processing with photolithographic developer.

Developing at room temperature, using 2.38% by weight TMAH (tetramethylamonimumhydroxide), the developer will partially etch the areas subjected to the first exposure level (170 milliseconds) in approximately 60 seconds and will remove the full thickness of resist layer 52 in the areas exposed to the second exposure level (500 milliseconds). Under normal ambient conditions (i.e., room temperature) the developer will remove approximately 1 μm from the photoresist in the first exposure pattern areas (72 in FIG. 3) leaving approximately 0.5–0.8 μm of resist after the development process is completed.

In the foregoing example, a single reticle was used containing both the first and second mask patterns thereon in exposing the photoresist. Separate reticles could alternatively be used one having the first mask pattern and one having the second mask pattern thereon.

Figure 5:
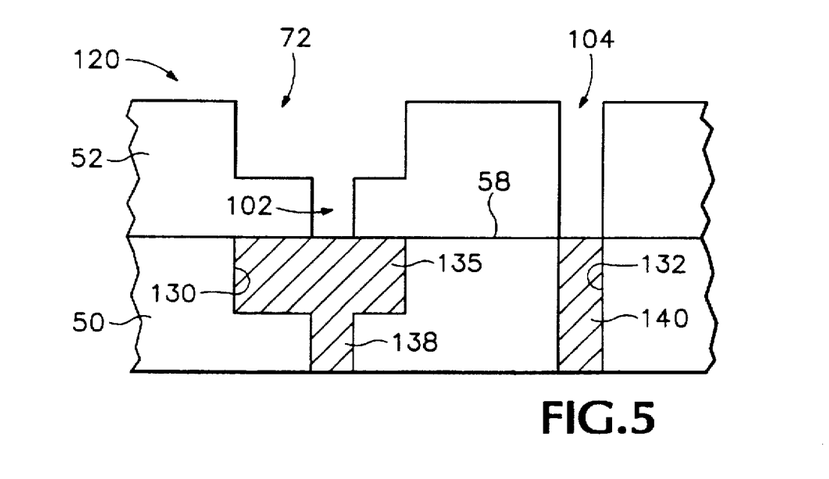
FIG. 5 is a cross-sectional view as in FIG. 2 showing the resist and the transfer of the multi-level resist profile to the interlevel dielectric.

FIG. 5 illustrates schematically how the multi-level photoresist mask 52 created in accordance with the above-described method, is used in integrated circuit processing. FIG. 5 shows a photoresist layer 52 with a multi-level mask pattern shown at 120, which is approximately the result of the steps illustrated in FIGS. 2, 3, and 4. By using a suitable technique for transferring the multi-level pattern in resist 52 into interlevel dielectric layer 50, the resist pattern is reproduced in the dielectric. Such a technique for transferring a multi-level resist pattern into a semiconductor substrate is disclosed in co-pending patent application Ser. No. 08/665,014, filed Jun. 10, 1996, entitled "Method for Transferring Multi-Level Photoresist Pattern", invented by Tue Nguyen, Sheng Teng Hsu, Jer-shen Maa, and Bruce Dale Ulrich, owned by the same assignees as is the present invention. Once the resist pattern has been transferred to dielectric layer 50, the resist layer 52 is then removed or stripped from the dielectric. At that point, using the damascene process, chemical vapor deposited copper (CVD copper) or another suitable metal is provided in the openings 130, 132 within dielectric layer 50. Once conductive metal is installed in openings 130, 132, the metal becomes part of interconnects and vias in the integrated circuit chip. For example, the wider portion of opening 130, adjacent the surface 58 of dielectric layer 50, might typically form an elongated metal interconnect 135 extending horizontally into and out of the page, as viewed in FIG. 5. Narrow conductor 138 is a via extending between conductor 135 and another conductor (not shown). Via 140 is a conductor which extends vertically between other conductors (not shown).

Figure 6:
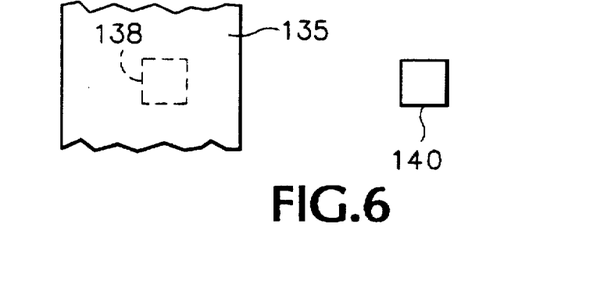
FIG. 6 is a top plan view of a portion of the vias and interconnect lines formed after the transfer shown in FIG. 5.

FIG. 6 provides a top view of conductor 135 and vias 138, 140 when viewed looking downward through surface 58 of interlevel dielectric layer 50 (FIG. 5). Conductor 135 is an elongated conductor recessed within the surface of dielectric layer 50. Via 138 extends downwardly from conductor 135 into the page, as viewed in FIG. 6. Similarly, via 140 extends into and out of the page, as viewed in FIG. 6.

A particular advantage of the method of the present invention is that it allows multi-level profiles to be formed in photoresist layer 52. In conventional prior art damascene processing, forming the multi-level opening 130, shown in substrate 50 of FIG. 5, required at least two photoresist exposure and developing steps. A layer of photoresist would first be applied to the substrate. A mask pattern corresponding to either conductor 135 or via 138 would be formed in the resist. The resist would be developed and the mask pattern transferred to the underlying dielectric layer. Then the photoresist would be stripped and a new layer of resist would then be applied to the substrate to form the remainder of the pattern. With the methodology of the present invention, a multi-level resist profile is formed using two different light exposure steps and only a single developing step. As such, the present invention reduces the number of processing steps for creating the photoresist mask and eliminates the alignment problems which arise when two different resist masks must be laid down at separate times on the substrate.

Figure 7:
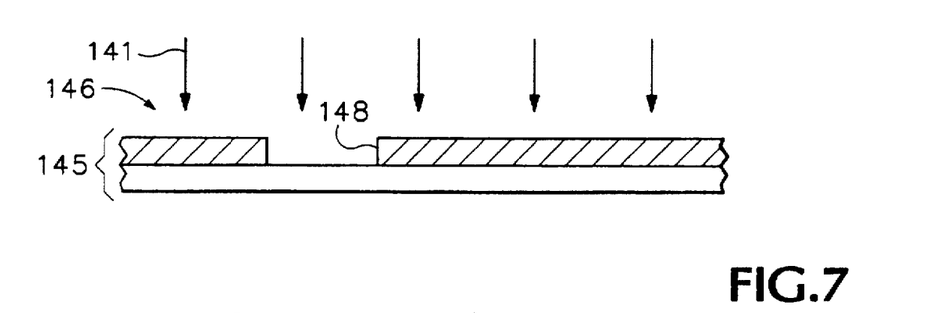
FIG. 7 is a cross-sectional view as in FIG. 2 showing the step of exposing the photoresist to light through a third mask pattern to create a third exposure pattern in the photoresist layer.
Figure 8:
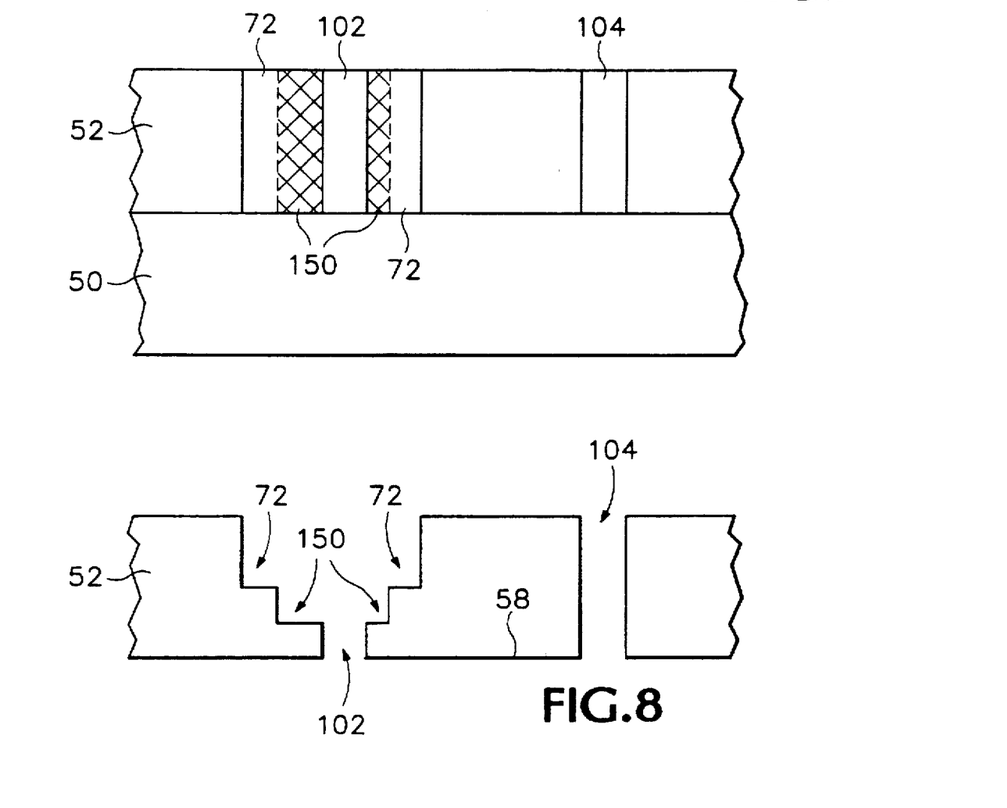
FIG. 8 is a cross-sectional view of the resist of FIG. 7 following the developing step, wherein a mask pattern having three thicknesses is created in the photoresist layer.

FIGS. 7 and 8 illustrate an alternative embodiment of the invention for creating additional levels in the photoresist layer 52. FIG. 7, which like FIGS. 3 and 4, assumes a 1:1 size relationship between the mask pattern on the reticle and the exposure pattern created on photoresist layer 52, shows the exposure of the photoresist to a third mask pattern. Photoresist layer 52 is assumed to have been exposed to the first and second mask patterns illustrated in FIGS. 2 and 3, respectively. In the embodiment of FIG. 7, light source 140 is used to expose selected areas of the resist to light of a third exposure level in a pattern defined by a third mask pattern on reticle 145. The third mask pattern 146 on reticle 145 is intended to create a third exposure pattern in photoresist layer 52 which is intermediate between the second exposure level of areas 102, 104 created by the second exposure pattern of reticle 88 (FIG. 3) and the first exposure areas 72 created by the first exposure pattern of reticle 60 (FIG. 2). In order to accomplish the goal, the third exposure level 140 will preferably be a very low dose of photons which are passed through mask opening 148. Only a low dose of photons is required because the effect of additional light energy is cumulative in photoresist layer 52. Since first exposure pattern 72 has already received a dose of photons, a small additional dose of photons is all that is required to yield a slightly higher exposure pattern in the crisscross hatched areas 150 receiving the light from the third exposure pattern. The effect of a small additional dose of photons in heavily-dosed region 102 is nil, since area 102 is intended as a via and all the photoresist will be removed during the developing step.

The result of exposing photoresist layer 52 to a third mask pattern using light at a third exposure level creates the third exposure pattern areas 150. As such, photoresist layer 52, in the example of FIG. 7, includes lightly dosed photoresist areas 72, slightly more heavily dosed areas 150 and substantially more heavily dosed areas 102, 104. When the exposed photoresist 52 in FIG. 7 is developed, the result is a photoresist layer having three different thicknesses, as shown in FIG. 8. Using the same methodology described above with reference to FIG. 4, the developer will etch the resist more slowly in regions 72 which receive the lowest dose of photons. The areas 150 which received a slightly higher dose of photons will be etched somewhat faster, thereby removing additional thickness of the photoresist layer from areas 150. The developer will remove the full thickness of the photoresist layer from areas 102, 104. The result is a three-level resist profile, as shown in FIG. 8.

The size and configuration of each reticle is a matter of design choice within the knowledge of those skilled in the art, as is the size and orientation of the selected region of the photoresist exposed during each exposing step. The invention provides a methodology for making multiple exposures in different desired patterns and configurations on a photoresist layer to create multi-level profiles in the resist. Before the photoresist is developed, a plurality of different exposure patterns using different light exposure levels will yield a plurality of regions in the photoresist having different light exposure levels. Each region or area which has been exposed to a different dose of light energy or photons can be processed during the development step to yield a different thickness in the final photoresist profile. As long as different dose levels can be discriminated during the development step to yield different thicknesses of resist, the process can be used to produce numerous different thicknesses of photoresist in a single photoresist mask. The preferred embodiment described above used a first (lower) exposure level for the first pattern and a second (higher) exposure level for the second pattern. The order in which the lower and higher exposure levels are processed is arbitrary and it would be equally effective to expose the second pattern, at the higher exposure level, first and the first pattern, at the lower exposure level, second. What is important is that in the areas where less photoresist is to be removed, lower exposure levels are used. Although the foregoing description includes processing of up to three different thicknesses in a single photoresist mask, the process is not limited to any particular number of levels and more than three levels can be provided in the photoresist by illuminating selected areas of the photoresist at sufficiently different exposure levels to allow the removal of different thicknesses during the development step. Other variations within the scope of the present invention will occur to those skilled in the art.

What is claimed is:

1. A method of forming a multi-level profile in a layer of photoresist on a semiconductor wafer, the method comprising the following steps:
    a) providing a layer of photoresist having a predetermined thickness on the wafer;
    b) directing light to the photoresist on the wafer through a reticle having a first mask pattern which includes openings through which the light passes to create a first exposure pattern in the photoresist;
    c) before developing the photoresist, again directing light to the photoresist on the wafer through a reticle having a second mask pattern which includes openings through which the light passes to create a second exposure pattern in the photoresist; and
    d) developing the photoresist to remove a first thickness of the photoresist, less than said predetermined thickness, in the areas of said first exposure pattern, and to remove a second thickness of the photoresist in the areas of said second exposure pattern, whereby the layer of photoresist on the wafer includes a plurality of different thicknesses.

2. A method as in claim 1 including, after step c) and before step d), again directing light to the photoresist on the wafer through a reticle having a third mask pattern which includes openings through which the light passes to create a third exposure pattern in the photoresist, and wherein step d) further includes removing a third thickness of the photoresist in the areas of said third exposure pattern, whereby the layer of photoresist on the wafer includes at least three different thicknesses.

3. A method as in claim 1 wherein step b) includes exposing the photoresist on the wafer through the reticle to light at a first exposure level to create the first exposure pattern, and step c) includes exposing the photoresist on the wafer through the reticle to light at a second exposure level which is higher than said first exposure level to create the second exposure pattern.

4. A method as in claim 1 wherein said second exposure pattern created in step c) at least partially overlaps said first exposure pattern created in step b).

5. A method as in claim 1 wherein the light used in step c) has a larger dose of photons per unit area than the light used in step b), and step d) includes developing the photoresist to remove substantially the full predetermined thickness of the photoresist in the areas of the second exposure pattern and to remove only said first thickness of the photoresist, less than said predetermined thickness, in the areas of said first exposure pattern.

6. A method of forming a multi-level profile in a layer of photoresist on a semiconductor wafer, the layer of photoresist overlying a dielectric layer in which conductive interconnects and vias are formed to make integrated circuit connections between devices formed on the wafer, the method comprising the following steps:
    a) providing a layer of photoresist having a predetermined thickness on the wafer between the dielectric layer and the surface of the photoresist;
    b) directing light through a reticle having a first mask pattern which includes openings through which the directed light passes, such that the light creates a first exposure pattern in the photoresist;
    c) directing light through a reticle having a second mask pattern which includes opening s through which the directed light passes, such that the light creates a second exposure pattern in the photoresist, said first and second exposure patterns at least partially overlapping such that selected areas of said first and second exposure patterns have different levels of exposure to the directed light; and
    d) after steps b) and c), developing the photoresist to remove a first thickness of the photoresist, less than said predetermined thickness, in the areas exposed to lower exposure levels of light, and to remove a second thickness of the photoresist, greater than said first thickness, in the areas exposed to higher exposure levels of light, whereby the layer of photoresist on the wafer includes areas having a plurality of different thicknesses.

7. A method as in claim 6 in which said second exposure pattern overlaps portions of said first exposure pattern such that a higher exposure level of light occurs in the photoresist in the areas of said second mask pattern.

8. A method of forming a multi-level profile in a layer of photoresist applied to a layer of dielectric on a semiconductor wafer, the layer of dielectric being where patterned interconnects and vias are provided on the wafer, the method comprising:
    a) providing a layer of photoresist having a predetermined thickness on the wafer overlying the dielectric layer;

b) exposing to light at a first exposure level through a first mask pattern on a reticle selected areas of the photoresist to create a first exposure pattern in the photoresist;

c) before developing the photoresist, exposing to light at a second exposure level through a second mask pattern on a reticle selected areas of the photoresist to create a second exposure pattern in the photoresist; and d) developing the photoresist to remove a first thickness of the photoresist in the areas of said first exposure pattern and to remove a second thickness of the photoresist in the areas of said second exposure pattern, whereby the layer of photoresist on the wafer resulting from step d) includes areas of photoresist having a plurality of different thicknesses.

9. A method as in claim 8 in which one of said first and second thicknesses removed in step d) is substantially equal to the predetermined thickness of the photoresist, such that the full layer of photoresist is removed in areas corresponding to one of said first and second exposure patterns.

10. A method as in claim 8 including, after step c) and before step d), exposing to light at a third exposure level through a third mask pattern on a reticle selected areas of the photoresist to create a third exposure pattern in the photoresist, and wherein step d) further includes developing the photoresist to remove a third thickness of the photoresist in the areas of said third exposure pattern, whereby the layer of photoresist on the wafer resulting from step d) includes areas of photoresist having at least three different thicknesses.

11. A method as in claim 8 in which the second exposure level of light used in step c) is higher than the first exposure level of light used in step b), such that a greater thickness of photoresist is removed during developing step d) from the areas of the second exposure pattern than from the areas of the first exposure pattern.

12. A method as in claim 11 in which the second exposure pattern overlaps portions of the first exposure pattern and the thickness of photoresist removed from the areas of the second exposure pattern during developing step d) is substantially the full predetermined thickness of the photoresist layer, whereby the second exposure pattern is used to define where vias are formed in the substrate.

13. A method as in claim 11 in which the thickness of photoresist removed from the areas of the second exposure pattern during developing step d) is substantially the full predetermined thickness of the photoresist layer, whereby the second exposure pattern is used to define where vias are formed in the substrate.

14. A method as in claim 9 in which the reticle having said first mask pattern formed thereon and the reticle having said second mask pattern formed thereon are the same reticle and steps b) and c) each include moving the reticle to a position in which light at said respective first and second exposure levels is directed, in step b), through the portion of the reticle on which said first mask pattern is formed and, in step c), through the portion of the reticle on which said second mask pattern is formed.

* * * * *